United States Patent
Harame et al.

(10) Patent No.: US 8,841,750 B2
(45) Date of Patent: Sep. 23, 2014

(54) LOCAL WIRING FOR A BIPOLAR JUNCTION TRANSISTOR INCLUDING A SELF-ALIGNED EMITTER REGION

(75) Inventors: David L. Harame, Essex Junction, VT (US); Zhong-Xiang He, Essex Junction, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 13/551,971

(22) Filed: Jul. 18, 2012

(65) Prior Publication Data

US 2014/0021587 A1    Jan. 23, 2014

(51) Int. Cl.
*H01L 29/732* (2006.01)
*H01L 29/66* (2006.01)
*H01L 29/73* (2006.01)
*H01L 29/08* (2006.01)

(52) U.S. Cl.
CPC .......... *H01L 29/66234* (2013.01); *H01L 29/73* (2013.01); *H01L 29/66287* (2013.01); *H01L 29/732* (2013.01); *H01L 29/0804* (2013.01)
USPC ............ 257/578; 438/343; 257/588; 257/587

(58) Field of Classification Search
CPC .................................................. H01L 29/7325
USPC ............................ 438/343; 257/578, 586, 587
See application file for complete search history.

(56) References Cited

U.S. PATENT DOCUMENTS

| | | | |
|---|---|---|---|
| 5,166,081 A | 11/1992 | Inada et al. | |
| 5,428,243 A | 6/1995 | Wylie | |
| 6,940,149 B1 | 9/2005 | Divakaruni et al. | |
| 6,962,842 B1 | 11/2005 | Kalnitsky et al. | |
| 7,687,887 B1 * | 3/2010 | El-Diwany et al. | 257/565 |
| 7,709,338 B2 | 5/2010 | Liu et al. | |
| 7,838,375 B1 | 11/2010 | Xu et al. | |
| 7,927,958 B1 | 4/2011 | Xu et al. | |
| 7,985,616 B1 * | 7/2011 | Sutardja et al. | 438/95 |
| 8,030,128 B1 * | 10/2011 | Sutardja et al. | 438/102 |
| 8,148,799 B2 * | 4/2012 | El-Diwany et al. | 257/586 |
| 8,558,210 B2 * | 10/2013 | Rajendran et al. | 257/3 |
| 2011/0198671 A1 | 8/2011 | Boccardi et al. | |
| 2014/0021587 A1 * | 1/2014 | Harame et al. | 257/565 |

* cited by examiner

*Primary Examiner* — George Fourson, III
(74) *Attorney, Agent, or Firm* — Michael J. LeStrange; Hoffman Warnick LLC

(57) ABSTRACT

Aspects of the invention provide for a bipolar transistor of a self-aligned emitter. In one embodiment, the invention provides a method of forming local wiring for a bipolar transistor with a self-aligned sacrificial emitter, including: performing an etch to remove the sacrificial emitter to form an emitter opening between two nitride spacers; depositing an in-situ doped emitter into the emitter opening; performing a recess etch to partially remove a portion of the in-situ doped emitter; depositing a silicon dioxide layer over the recessed in-situ doped emitter; planarizing the silicon dioxide layer via chemical mechanical polishing; etching an emitter trench over the recessed in-situ doped emitter; and depositing tungsten and forming a tungsten wiring within the emitter trench via chemical mechanical polishing.

20 Claims, 12 Drawing Sheets

LOCAL WIRING FOR A BIPOLAR JUNCTION TRANSISTOR INCLUDING A SELF-ALIGNED EMITTER REGION

FIELD OF THE INVENTION

The disclosure relates generally to integrated circuit (IC) devices and fabrication, and more particularly, to a bipolar junction transistor of a BiCMOS device including a tungsten local wiring for a self-aligned emitter region, and a related method.

BACKGROUND

In BiCMOS technology, bipolar transistors are integrated with CMOS transistors within a single integrated circuit (IC) device. In integrating these two different technologies, it is generally desirable to build a bipolar device that performs at fast speeds. An important figure of merit to determine whether the device performs fast enough is the $f_t$ frequency.

The $f_t$ frequency is the frequency at which transistor has a current gain equal to one. A faster transistor will have a high $f_t$. In order to produce a faster transistor, the emitter resistance and the base resistance must also be lower.

BRIEF SUMMARY

Aspects of the invention provide for a bipolar transistor of a self-aligned emitter. In one embodiment, the invention provides a method of forming local wiring for a bipolar transistor with a self-aligned sacrificial emitter, including: performing an etch to remove the sacrificial emitter to form an emitter opening between two nitride spacers; depositing an in-situ doped emitter into the emitter opening; performing a recess etch to partially remove a portion of the in-situ doped emitter; depositing a silicon dioxide layer over the recessed in-situ doped emitter; planarizing the silicon dioxide layer via chemical mechanical polishing; etching an emitter trench over the recessed in-situ doped emitter; and depositing tungsten and forming a tungsten wiring within the emitter trench via chemical mechanical polishing.

A first aspect of the disclosure provides a method of forming local wiring for a bipolar transistor with a self-aligned sacrificial emitter, comprising: performing an etch to remove the sacrificial emitter to form an emitter opening between two nitride spacers; depositing an in-situ doped emitter into the emitter opening; performing a recess etch to partially remove a portion of the in-situ doped emitter; depositing a silicon dioxide layer over the recessed in-situ doped emitter; planarizing the silicon dioxide layer via chemical mechanical polishing; etching an emitter trench over the recessed in-situ doped emitter; and depositing tungsten and forming a tungsten wiring within the emitter trench via chemical mechanical polishing.

A second aspect of the disclosure provides a method of forming local wiring for a bipolar transistor with a self-aligned sacrificial emitter, comprising: performing an etch to remove the sacrificial emitter to form an emitter opening between two nitride spacers; depositing an in-situ doped emitter into the emitter opening; performing a recess etch to partially remove a portion of the in-situ doped emitter; depositing a silicon dioxide layer over the recessed in-situ doped emitter; planarizing silicon dioxide layer via chemical mechanical polishing; etching an emitter trench over the recessed in-situ doped emitter and base trenches in base regions of the bipolar transistor; and depositing a tungsten forming a tungsten wiring within the emitter trench and the base trenches via chemical mechanical polishing.

A third aspect of the disclosure provides a method of forming local wiring for a bipolar transistor with a self-aligned sacrificial emitter, comprising: performing a silicon dioxide etch to form base trenches in base regions of the bipolar transistor; depositing tungsten and forming a tungsten wiring within the base trenches via chemical mechanical polishing; depositing a silicon dioxide layer to bury the tungsten wiring in the base trenches; performing an etch to remove the sacrificial emitter to form an emitter opening between two nitride spacers; depositing an in-situ doped emitter into the emitter opening; performing a recess etch to partially remove a portion of the in-situ doped emitter; depositing an silicon dioxide layer over the recessed in-situ doped emitter; planarizing silicon dioxide layer via chemical mechanical polishing; etching an emitter trench over the recessed in-situ doped emitter and base trenches in base regions of the bipolar transistor; and depositing tungsten and forming a tungsten wiring within the emitter trench via chemical mechanical polishing.

A fourth aspect of the disclosure provides a device structure for a bipolar junction transistor with a self-aligned sacrificial emitter, the device structure comprising: a recessed in-situ doped emitter over a base layer; a silicon dioxide layer over the recessed in-situ doped emitter; an emitter trench within the silicon dioxide layer and over the recessed in-situ doped emitter, the emitter trench including a tungsten wiring; and base trenches in the silicon dioxide layer over base regions, the base trenches including the tungsten wiring.

BRIEF DESCRIPTION OF THE DRAWINGS

The above and other aspects, features and advantages of the disclosure will be better understood by reading the following more particular description of the disclosure in conjunction with the accompanying drawings.

Figure 1:
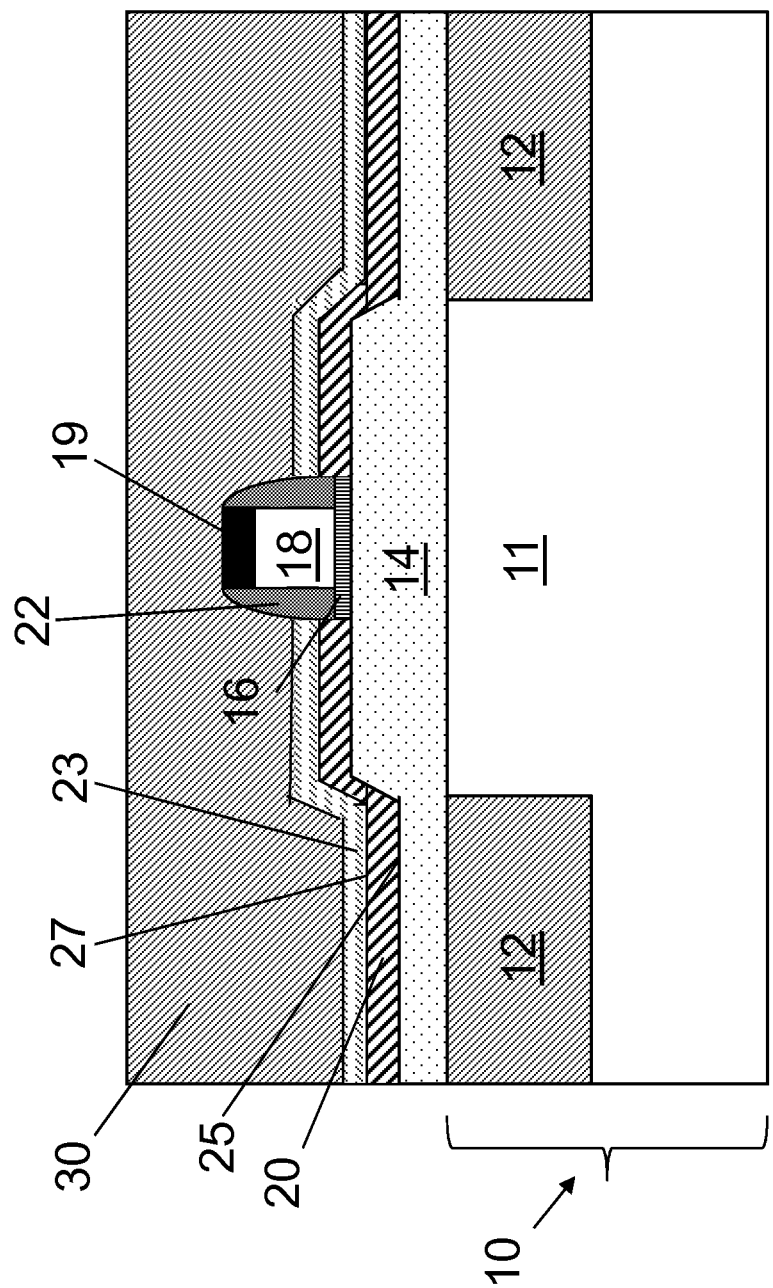
FIG. 1 shows a cross-sectional side view of a method of forming local wiring for a bipolar transistor according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to integrated circuit (IC) devices and fabrication, and more particularly, to a bipolar junction transistor of a BiCMOS device including a tungsten local wiring for a self-aligned emitter region, and a related method.

In BiCMOS technology, bipolar transistors are integrated with CMOS transistors within a single integrated circuit (IC) device. In integrating these two different technologies, it is generally desirable to build a bipolar device that performs at fast speeds. An important figure of merit to determine whether the device performs fast enough is the $f_t$ frequency.

The $f_t$ frequency is the frequency at which transistor has a current gain equal to one. A faster transistor will have a high $f_t$. In order to produce a faster transistor, the emitter resistance and the base resistance must also be lower.

For Silicon-Germanium heterojunction bipolar transistors (HBTs) for 300 GHz and higher, the peak $f_t$ increases and this leads to the HBTs to require higher current carrying capabilities in the wires. However, with lateral scaling, there is a smaller area between the base and the emitter regions of the HBTs, so the reproducibility of creating an HBT with a low emitter resistance is of concern.

Aspects of the invention provide for a bipolar transistor of a self-aligned emitter. In one embodiment, the invention provides a method of forming local wiring for a bipolar transistor with a self-aligned sacrificial emitter, including: performing an etch to remove the sacrificial emitter to form an emitter opening between two nitride spacers; depositing an in-situ doped emitter into the emitter opening; performing a recess etch to partially remove a portion of the in-situ doped emitter; depositing a silicon dioxide layer over the recessed in-situ doped emitter; planarizing the silicon dioxide layer via chemical mechanical polishing; etching an emitter trench over the recessed in-situ doped emitter; and depositing tungsten and forming a tungsten wiring within the emitter trench via chemical mechanical polishing.

Turning now to the figures, a method of forming local wiring for a bipolar transistor with a self-aligned sacrificial emitter is shown. In FIG. 1, a cross-sectional side view of self-aligned sacrificial emitter 18 of a bipolar transistor according to embodiments of the invention is shown. The specific detailed process steps to form self-aligned sacrificial emitter 18 have been omitted for clarity purposes, only. However, as shown, a semiconductor substrate 10 including shallow trench isolation (STI) regions 12 is provided. Substrate 10 may be any suitable bulk substrate containing a semiconductor material that a person having ordinary skill in the art would recognize as suitable for forming an integrated circuit. For example, substrate 10 may be comprised of a monocrystalline silicon-containing material, such as single crystal silicon with a (100) crystal lattice orientation. The monocrystalline semiconductor material contained in the substrate 10 may contain a definite defect concentration and still be considered a single crystal. The semiconductor material constituting substrate 10 may be lightly doped with an impurity to alter its electrical properties.

Between STI regions 12 is a device region 11. Below device region 11 and STI regions 12 is a sub-collector region (not shown), as known in the art. A doped portion of device region 11 forms the electrically active collector region (not shown).

STI regions 12 may be formed by a conventional process in the substrate 10. In one embodiment, STI regions 12 may be formed by a STI technique that relies on lithography and a dry etching process to define the closed-bottomed trenches in substrate 10, fills the trenches with dielectric material, and planarizes the surface of substrate 10 using a chemical mechanical polishing (CMP) process. The dielectric may be an oxide of silicon, such as densified tetraethylorthosilicate (TEOS) deposited by chemical vapor deposition (CVD) or a high-density plasma (HDP) oxide deposited with plasma assistance. The STI regions 12 circumscribe and electrically isolate the device region 11 of the substrate 10 that is used in the fabrication of the bipolar junction transistor.

Using a low temperature epitaxial (LTE) growth process (typically at a growth temperature ranging from 400° C. to 850° C.), a base layer 14 may be deposited over semiconductor substrate 10. Base layer 14 may include materials suitable for forming an intrinsic base of the bipolar junction transistor. Base layer 14 may be comprised of a semiconductor material $Si_xGe_{1-x}$ including silicon (Si) and germanium (Ge) with the germanium content ranging from about 5 atomic percent and about 50 atomic percent. The germanium content of the intrinsic base layer 14 may be uniform or the germanium content of intrinsic base layer 14 may be graded or stepped across the thickness of intrinsic base layer 14. Base layer 14 over STI regions 12 is thinner than base layer 14 over the device region 11 of the semiconductor substrate 10. Base layer 14 includes a monocrystalline region above device region 11 and a polycrystalline region over STI regions 12. The thickness of the base layer 14 may range from approximately 10 nm to approximately 600 nm, with the largest layer thickness above device region 11. As the thickness of the base layer 14 increases, the width of the base layer 14 above the device region 11 likewise increases.

A uniform silicon dioxide layer 16 is deposited over base layer 14, and under sacrificial emitter 18. Silicon dioxide layer 16 may be a high temperature oxide (HTO) that is deposited using rapid thermal chemical vapor deposition (RTCVD) at temperatures of 500° C. or higher. However, it is understood that silicon dioxide layer 16 may be deposited or grown by another suitable deposition process. A thickness of oxide layer 16 may be approximately 50 Angstroms to approximately 300 Angstroms.

A sacrificial emitter pedestal 18 including, for example, polysilicon, is positioned atop of silicon oxide layer 16. Emitter pedestal 18 may include a cap layer 19. Cap layer 19 may be silicon dioxide and/or silicon nitride. As known in the art, the sacrificial emitter pedestal 18 may be formed using a deposition, photolithography and etch process.

A layer 20, which supplies the semiconductor material for an extrinsic base, is formed on the top surface 25 of the intrinsic base layer 14. The extrinsic base layer 20 may be comprised of the same material (e.g., $Si_xGe_{1-x}$ or Si) as intrinsic base layer 14 and is grown by a selective epitaxial growth (SEG) process. Alternatively, the materials comprising intrinsic base layer 14 and extrinsic base layer 20 may differ. Extrinsic base layer 20 is doped in situ during epitaxial growth with a concentration of a dopant, such as an impurity species from Group III of the Periodic Table (e.g., boron) effective to impart a p-type conductivity. The SEG process is usually performed at a sub-atmospheric process pressure (e.g., 40 torr) and typically with a substrate temperature between about 400° C. and about 750° C. The growth temperature may be at the lower end of the range if the layer 20 is comprised of $Si_xGe_{1-x}$. Growth is not initiated during the SEG process on the outer surfaces of the sacrificial emitter pedestal 18 so that the sacrificial emitter pedestal 18 remains uncovered by the material of extrinsic base layer 20, nor surface areas on substrate 10 covered by the dielectric layer used to form spacers 22 and outside of the surfaces areas on which the extrinsic base layer 20 is needed to form bipolar junction transistors on a BiCMOS chip.

During the selective growth process, the semiconductor material of the raised region (including beveled sides of the raised region) of intrinsic base layer 14 operates as a seed crystal or crystalline seed that establishes a crystallographic pattern for the semiconductor material of the extrinsic base layer 20 grown on the raised region. The crystallographic pattern of the raised region of intrinsic base layer 14 is reproduced during selective epitaxy in extrinsic base layer 20 over raised region so that this region of the extrinsic base layer 20 has the same lattice structure and crystalline orientation as intrinsic base layer 14. Another region of the extrinsic base 20, which is disposed over the trench isolation regions 12, is comprised of polycrystalline semiconductor material also formed by the selective epitaxy.

A silicide layer 23 is formed adjacent to the sacrificial emitter pedestal 18 (and nitride spacers 22) and over extrinsic base layer 20. The formation of silicide layer 23 includes consuming part of the extrinsic base layer 20 during formation. To this end, a conformal layer (not shown) of a silicide-forming metal is formed on the top surface 27 of extrinsic base layer 20 and over the sacrificial emitter pedestal 18 and spacers 22. The layer of silicide-forming metal may be a blanket layer deposited by, for example, a CVD process or a physical vapor deposition (PVD) process. In various embodiments, candidate refractory metals for the silicide-forming metal include, but are not limited to, titanium (Ti), cobalt (Co), or nickel (Ni), each of which has a sintering temperatures of 900° C. or less, exhibits stability on silicon up to a temperature of 950° C., is characterized by a resistivity in a range of 10 $\mu\Omega$-cm to 20 $\mu\Omega$-cm, and is thermally stable during subsequent processing steps. Preferably, the silicide in the silicide layer 23 represents the lowest resistivity phase of the particular metal silicide and is thermally stable at temperatures of subsequent processing steps. A capping layer (not shown) comprised of a metal nitride, such as titanium nitride (TiN) deposited by direct current (DC) sputtering or radio frequency (RF) sputtering, may be applied to the layer of silicide-forming metal.

A silicidation process is employed that involves one or more annealing steps to form a silicide phase. The silicide phase constituting silicide layer 23 may be characterized as a silicon-germanium silicide contingent upon the composition of extrinsic base layer 20. In a representative silicidation process, the metal and semiconductor material (e.g., Si or SiGe) are thermally reacted to an intermediate silicide material. The formation anneal is performed employing ambients and temperatures well known in the art that cause the reaction between the metal and semiconductor material. For example, the silicidation process may be conducted in an ambient consisting an inert gas such as nitrogen atmosphere, and by heating the silicide-forming metal utilizing one or more rapid thermal annealing (RTA) steps at an annealing temperature, which is contingent on the type of silicide, of about 400° C. to about 900° C. In silicidation processes, metal-rich silicides initially form and continue to grow until the metal is consumed. When the metal layer has been consumed, silicides of lower metal content begin to appear and can continue to grow by consuming the metal-rich silicides.

Following the formation anneal, any metal not converted into silicide and the capping layer may be removed with, for example, selective wet chemical etch processes. The wet chemical etch process for removing the unconverted metal may utilize, for example, a $H_2O_2/H_2SO_4$ solution or a $HNO_3/HCl$ solution. The wet chemical etch process for removing the capping layer, if comprised of TiN, may utilize a $HNO_3/HF$ solution or a mixture of $NH_4OH:H_2O_2:H_2O$ (SC1 solution).

After the unconverted metal and capping layer are removed, the silicide layer 23 may be subjected to another anneal process to form a lower-resistance phase for the specific silicide used in layer 23. The temperature for the transformation anneal of the silicide layer 23 may be higher than the temperature of the formation anneal.

The silicide layer 23 is formed around the sacrificial emitter pedestal 18, which does not support growth of the material constituting the silicide layer 23. As a result, the silicide layer 23 smoothly terminates at the perimeter of the sacrificial emitter pedestal 18 and the sacrificial emitter pedestal 18 projects through and above the silicide layer 23. These spatial relationships between the silicide layer 23 and the sacrificial emitter pedestal 18 provide the self-alignment between silicide layer 23 and the emitter 26 (FIGS. 3-7 and 11). Because the same structure (i.e., the sacrificial emitter pedestal 18) is used during self-alignment, the silicide layer 23 and extrinsic base 20 are both self-aligned relative to the emitter 26.

A thick oxide layer 30 is deposited over sacrificial emitter 18 and over silicide layer 23. Oxide layer 30 may be deposited using, for example CVD or plasma-enhanced CVD, and is planarized using a chemical mechanical polishing (CMP) process.

Figure 2:
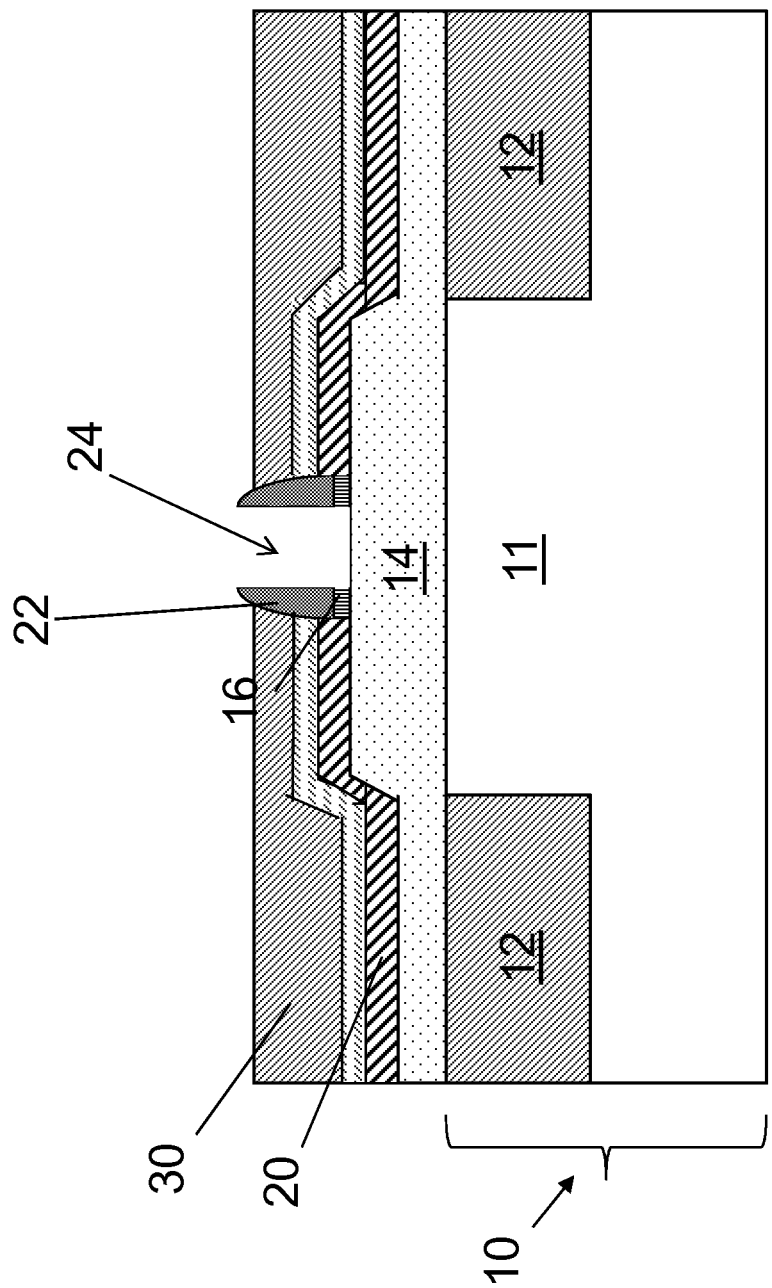
FIG. 2 shows a cross-sectional side view of a method of forming local wiring for a bipolar transistor according to embodiments of the invention.

Turning now to FIG. 2, selective reactive ion etch (RIE) is performed to remove the sacrificial emitter 18 (FIG. 1) and forms an emitter opening 24 between nitride spacers 22. The silicon oxide layer 16 may also be removed using a chemical etch, such as a chemical oxide removal (COR) or a diluted hydrofluoric acid (DHF) solution, followed by a short pre-epitaxy clean may be used with minimal undercut into the silicon oxide layer 16 that is under the nitride spacers 22.

Figure 3:
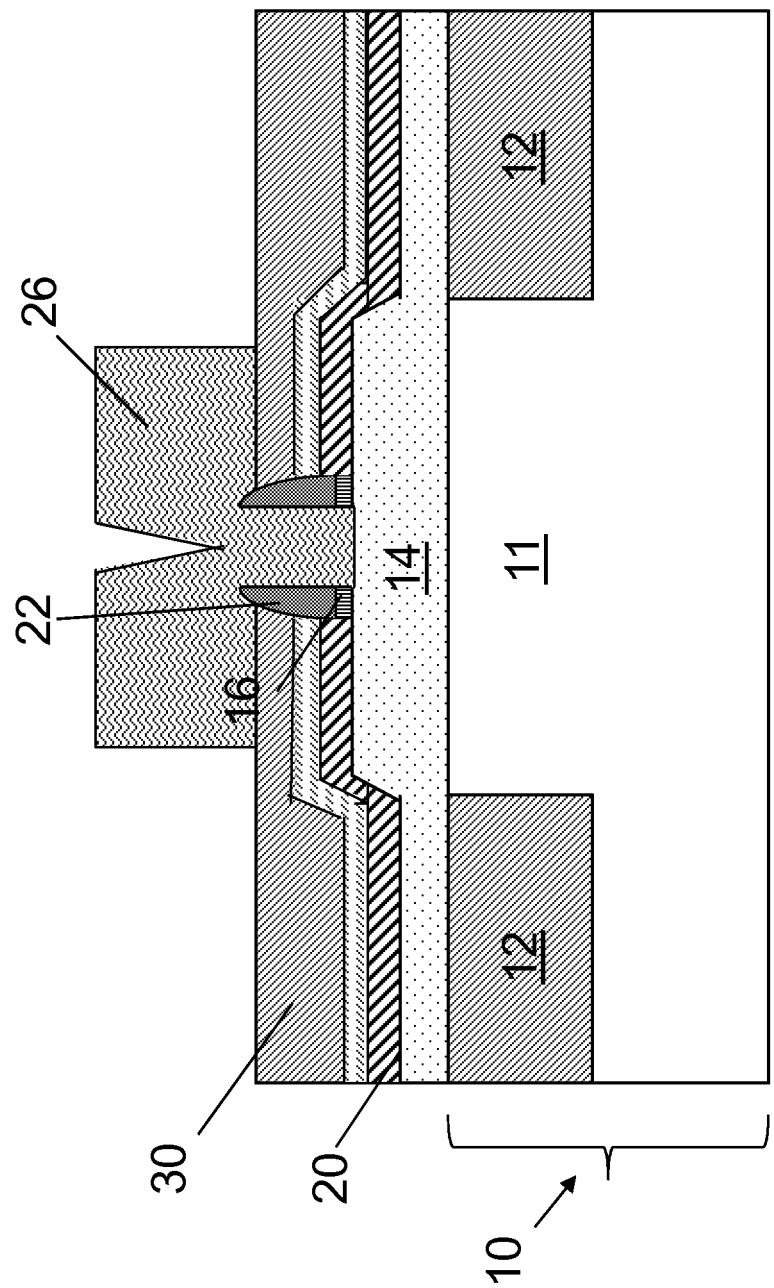
FIG. 3 shows a cross-sectional side view of a method of forming local wiring for a bipolar transistor according to embodiments of the invention.
Figure 4:
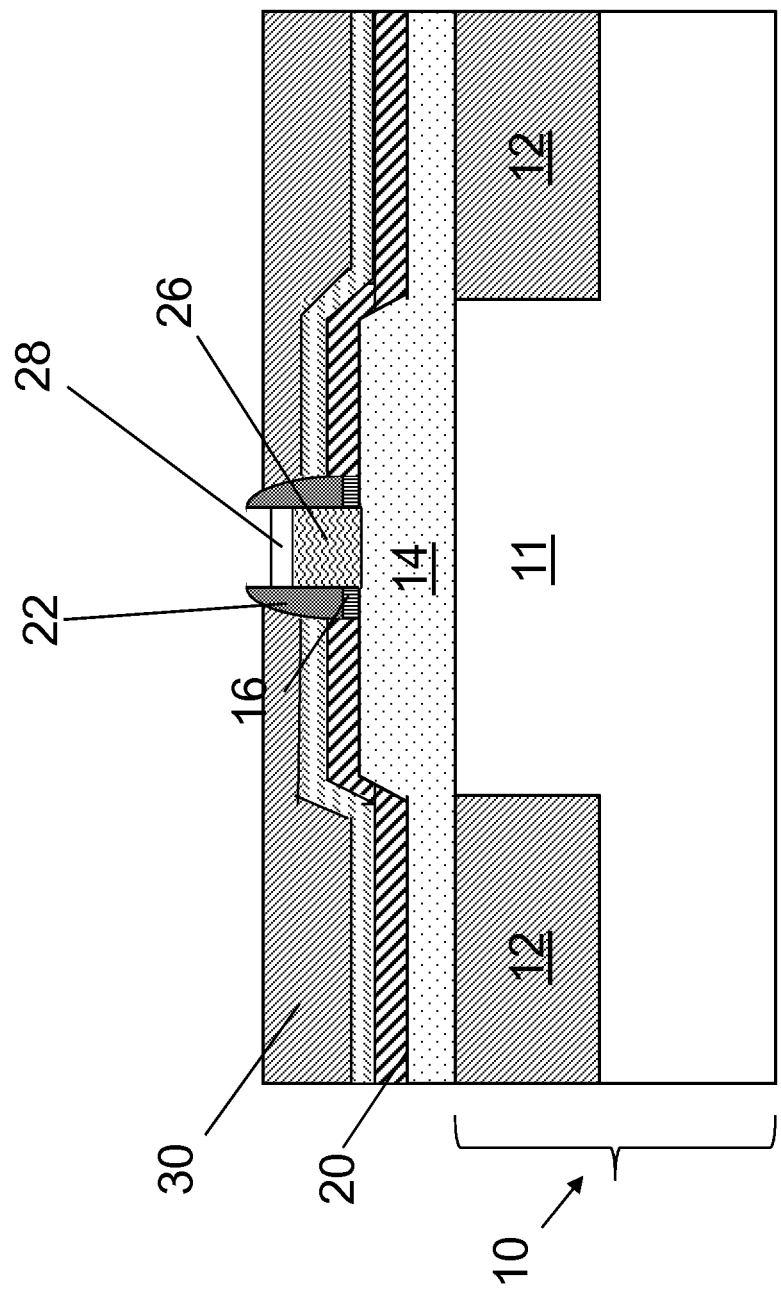
FIG. 4 shows a cross-sectional side view of a method of forming local wiring for a bipolar transistor according to embodiments of the invention.
Figure 5:
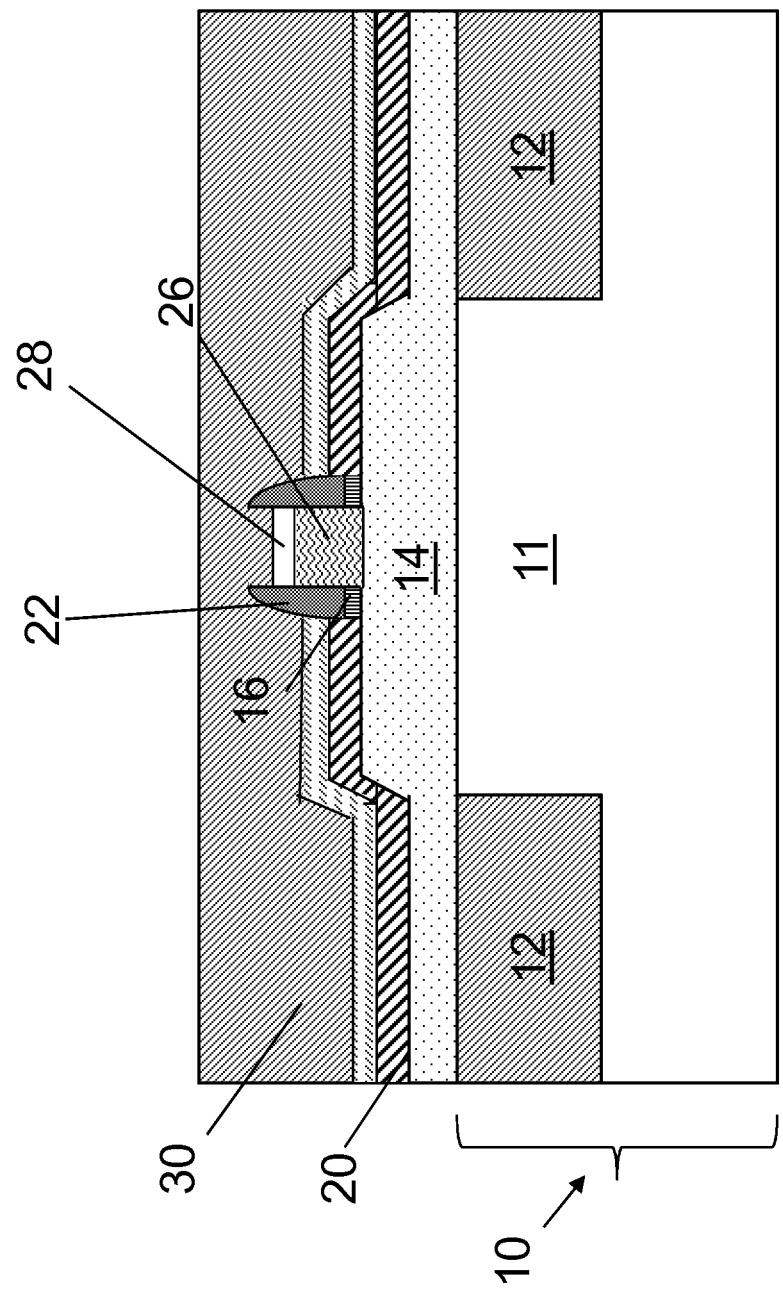
FIG. 5 shows a cross-sectional side view of a method of forming local wiring for a bipolar transistor according to embodiments of the invention.

Turning now to FIGS. 3 and 4, an in-situ doped emitter 26 is deposited into the emitter opening 24, and is partially etch to remove a portion of the in-situ doped emitter 26, so that the in-situ doped emitter 26 is below the nitride spacers 22. As shown in FIG. 4, an optional silicide layer 28 is formed and deposited over the recessed in-situ doped emitter 26. Turning now to FIG. 5, an oxide layer (shown as oxide layer 30), such as, for example, silicon dioxide, is deposited using, for example CVD or plasma-enhanced CVD, and is planarized using a chemical mechanical polishing (CMP) process.

Figure 6:
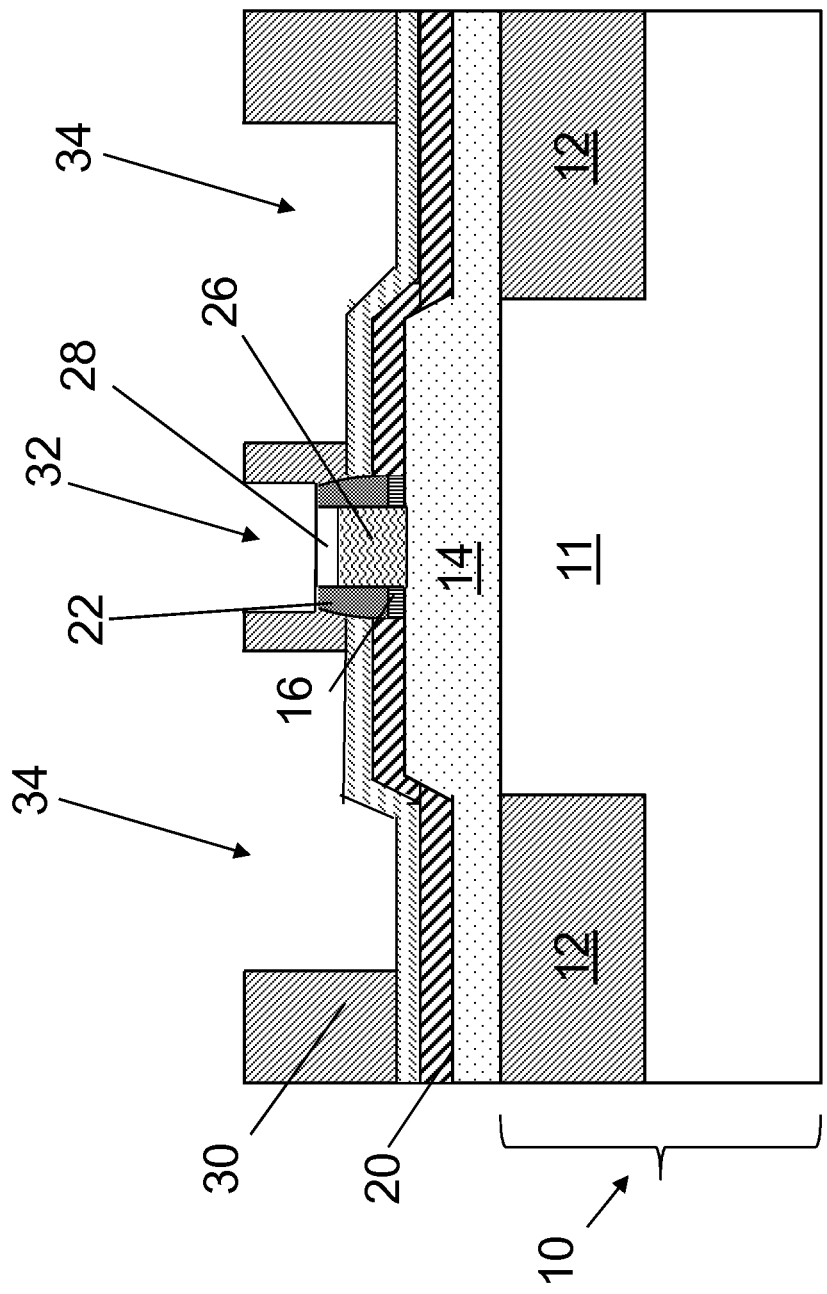
FIG. 6 shows a cross-sectional side view of a method of forming local wiring for a bipolar transistor according to embodiments of the invention.

Turning now to FIG. 6, an emitter trench 32 is etched into oxide layer 30, over the recessed in-situ doped emitter 26 (and silicide layer 28). Simultaneously, base trenches 34 may also be etched into oxide layer 30, with an etch stop at silicide layer 23. An optional barrier nitride layer may also be present, although not shown in the figures.

Figure 7:
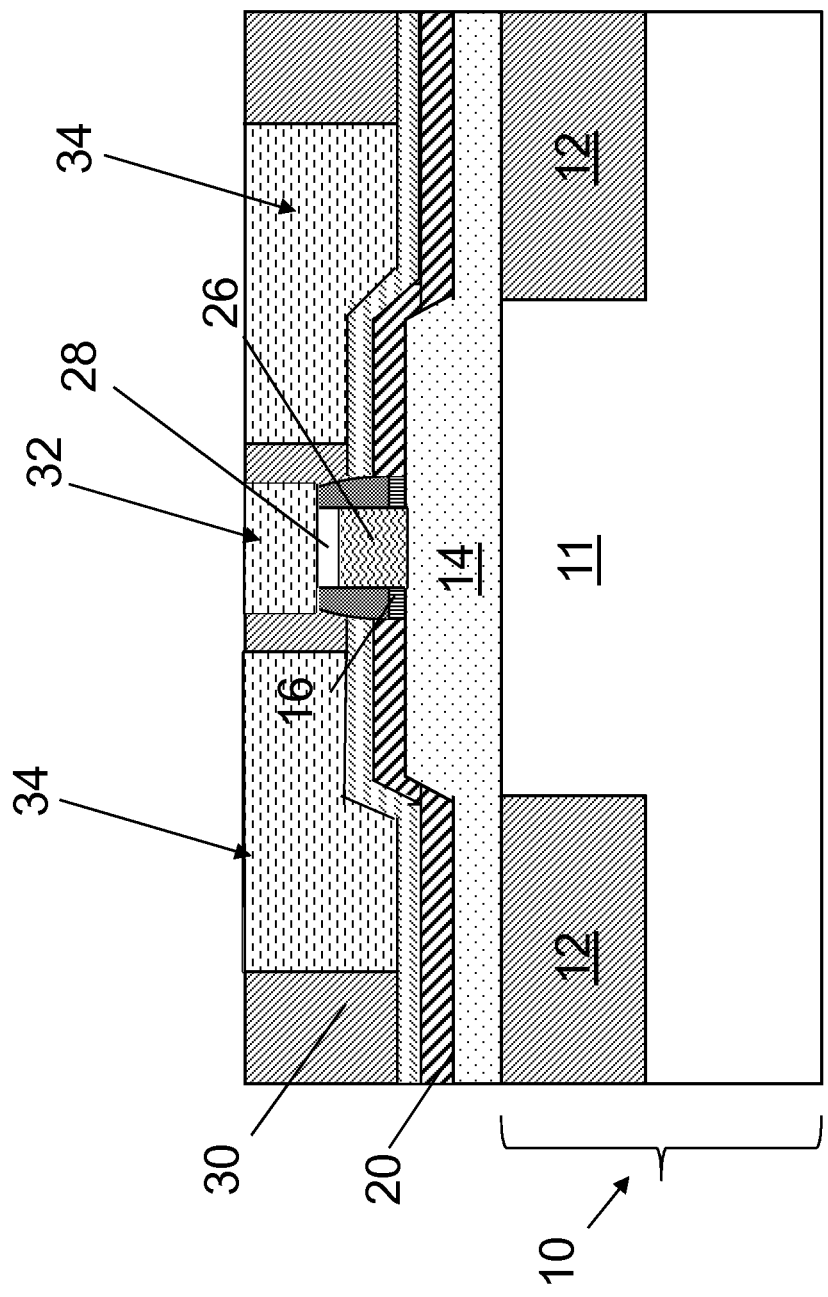
FIG. 7 shows a cross-sectional side view of a method of forming local wiring for a bipolar transistor according to embodiments of the invention.
Figure 8:
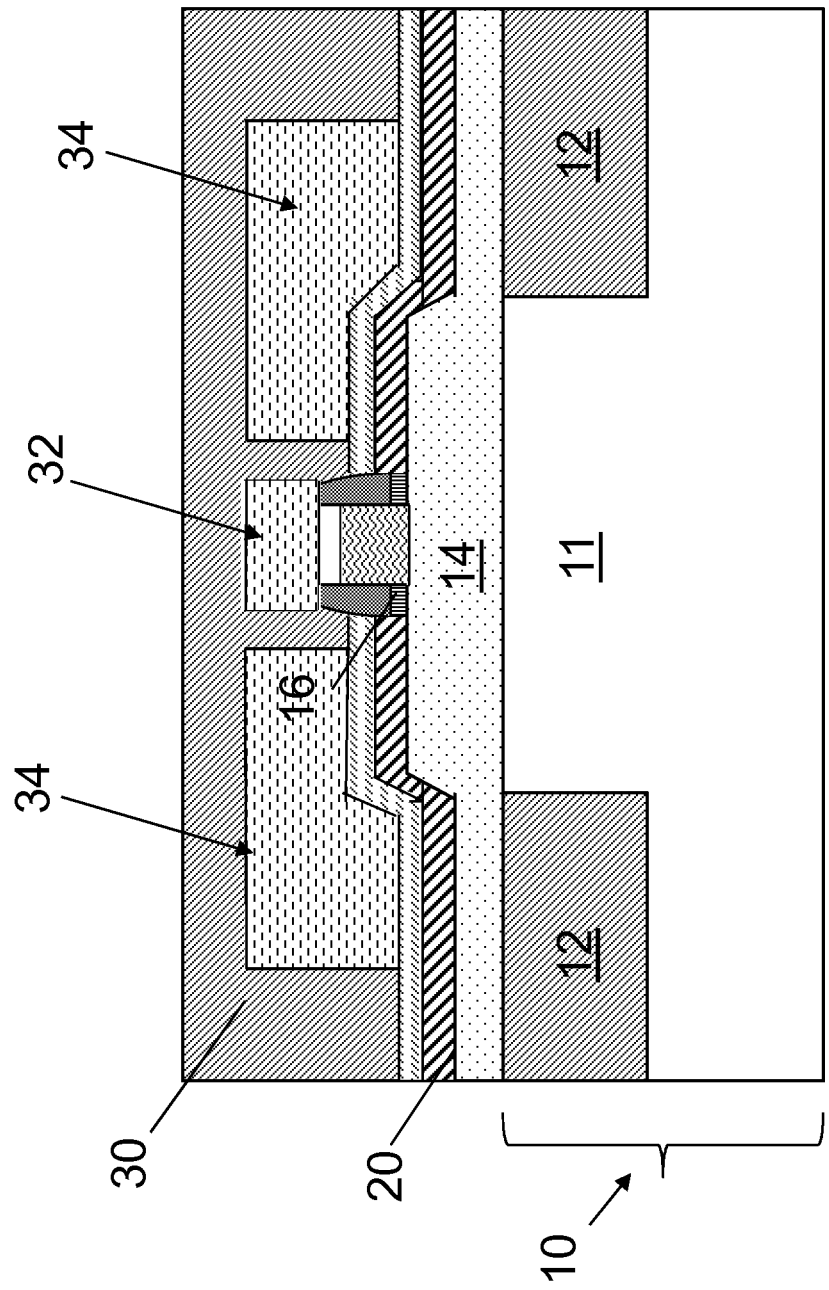
FIG. 8 shows a cross-sectional side view of a method of forming local wiring for a bipolar transistor according to embodiments of the invention.

At FIG. 7, a tungsten (W) wiring is deposited into the emitter trench 32. Further, a tungsten (W) wiring may also be deposited into base trenches 34. Tungsten (W) wiring may be deposited using any deposition technique, such as a sputtering deposition or physical vapor deposition (PVD). Further, the tungsten (W) wiring may be planarized using a CMP process. As seen in FIG. 8, an additional oxide layer (shown as oxide layer 30) is deposited over tungsten (W) wiring in emitter trench 32 and in base trenches 34 in order to bury the tungsten (W) wiring. The self-aligned sacrificial emitter (SASE) process improves the current carrying capability of the W wiring of the emitter and base of this bipolar transistor. The self-aligned sacrificial emitter is narrower, which allows for a lower emitter resistance, and a faster overall device.

Figure 9:
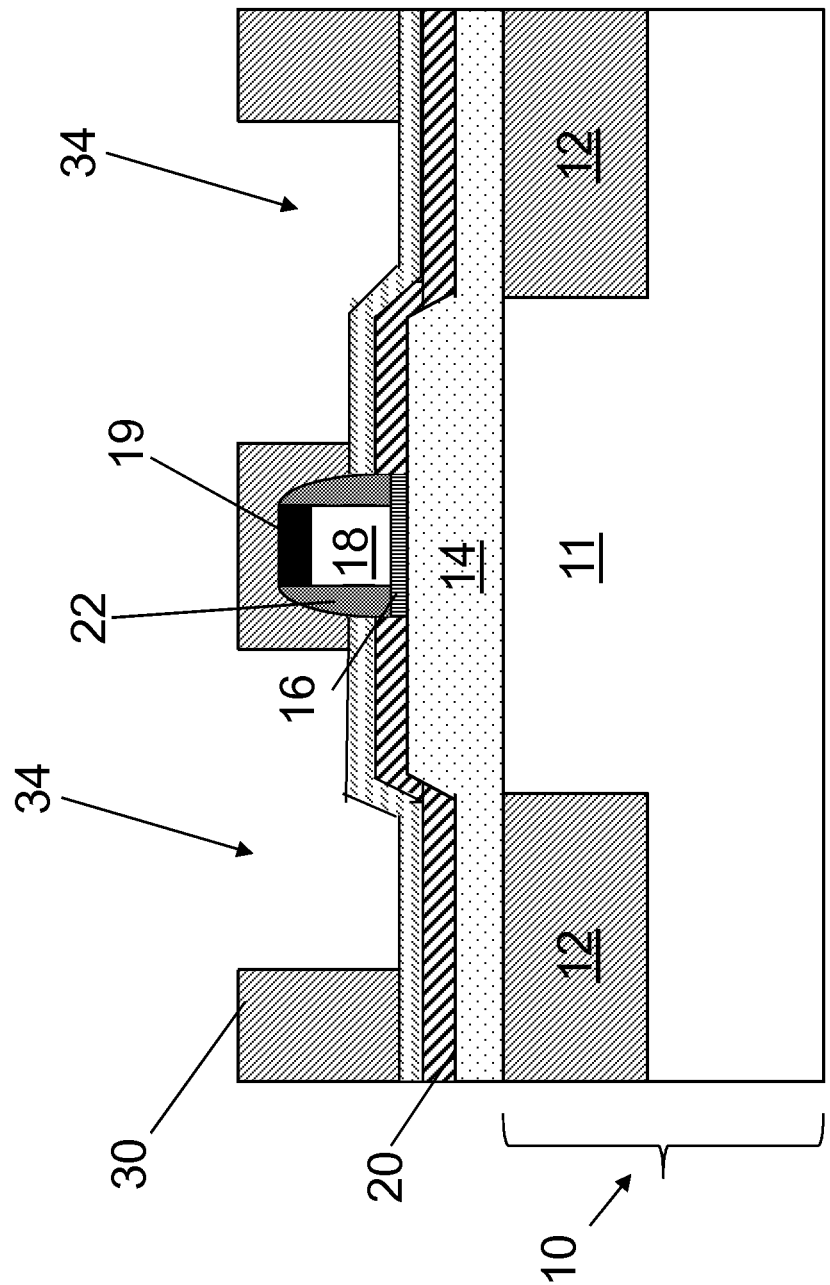
FIG. 9 shows a cross-sectional side view of a method of forming local wiring for a bipolar transistor according to embodiments of the invention.
Figure 10:
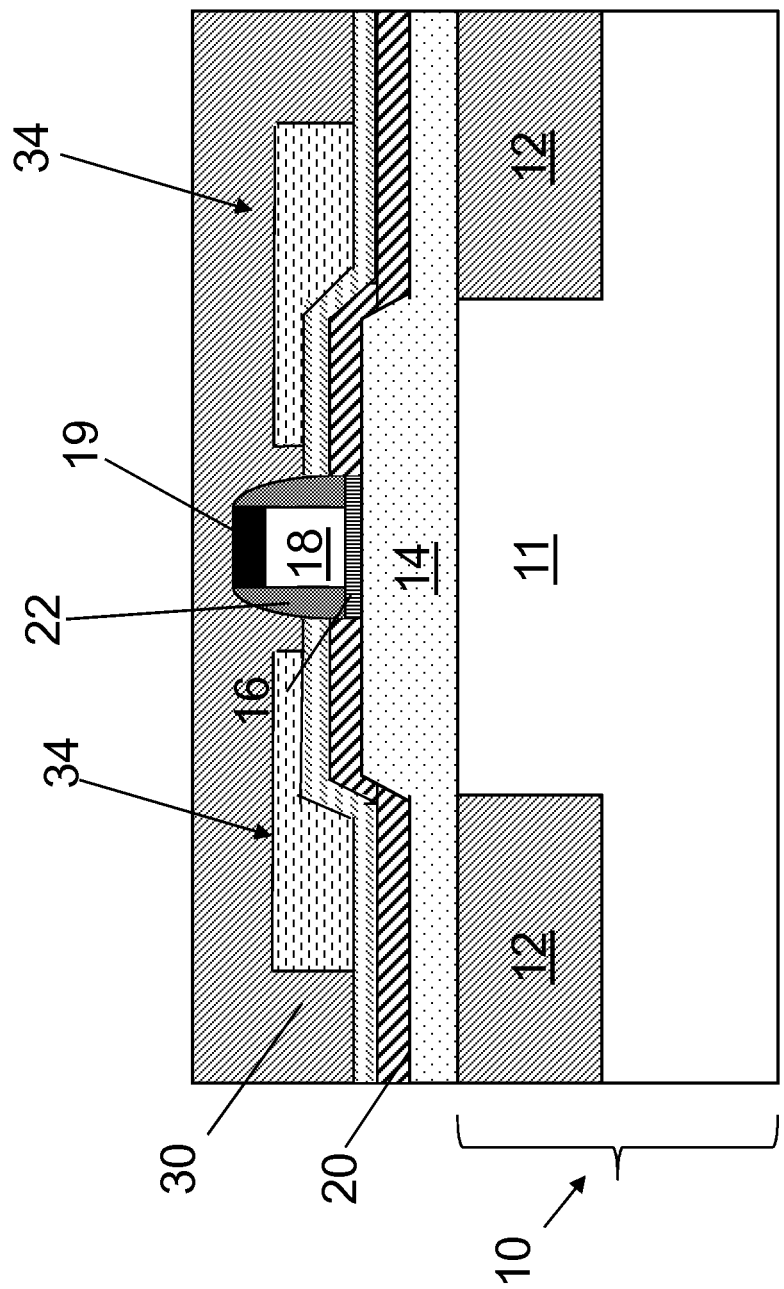
FIG. 10 shows a cross-sectional side view of a method of forming local wiring for a bipolar transistor according to embodiments of the invention.
Figure 11:
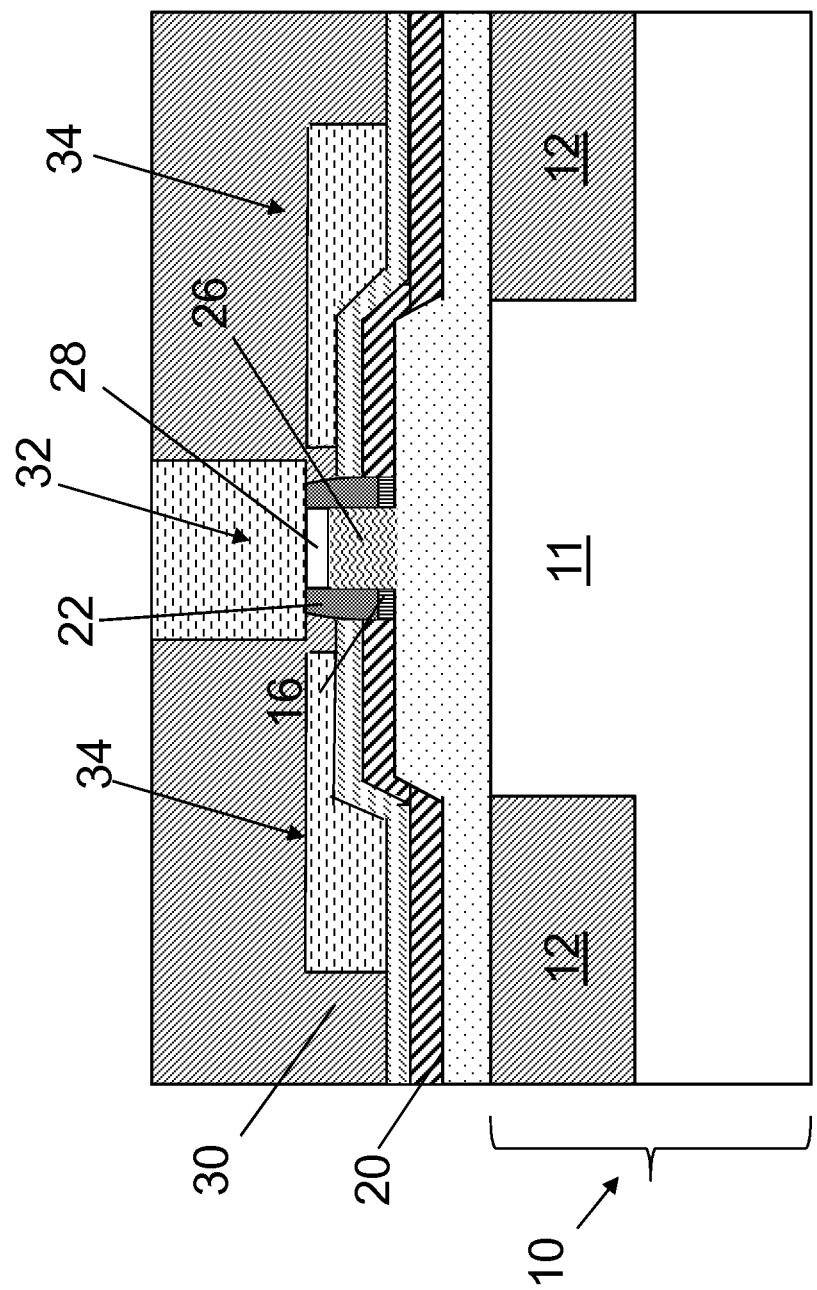
FIG. 11 shows a cross-sectional side view of a method of forming local wiring for a bipolar transistor according to embodiments of the invention.

Turning now to FIGS. 9-11, an alternative embodiment of forming local wiring for a self-aligned sacrificial emitter of a bipolar transistor is shown. This alternative embodiment begins with the same self-aligned sacrificial emitter 18 in FIG. 1. However, as seen in the cross-sectional view of FIG. 9, prior to the emitter formation, an oxide etch is performed to form base trenches 34, with a etch stop at the silicide layer 23. Prior to this oxide etch, a CMP may be performed on the oxide layer 30, and stop at approximately 200 nanometers (nm) above the sacrificial emitter 18.

Turning now to FIG. 10, tungsten (W) wiring is deposited into the base trenches 34. The tungsten (W) wiring is planarized by a CMP and recess etch is performed so that the wiring is below the nitride spacers 22. Further, an oxide layer (shown as oxide layer 30) is deposited (and planarized by a CMP) to bury the tungsten (W) wiring in base trenches 34.

Turning now to FIG. 11, as similarly shown in and describe with FIGS. 2-6 above, selective reactive ion etch (RIE) is performed to remove the sacrificial emitter 18 (FIG. 1) and to form an emitter opening 24 between nitride spacers 22. However, the base trenches 34 have already been formed and the tungsten (W) wiring in base trenches 34 is buried within oxide layer 30. The silicon oxide layer 16 may also be removed using a chemical etch, such as a chemical oxide removal (COR) or a diluted hydrofluoric acid (DHF) solution, followed by a short pre-epitaxy clean may be used with minimal undercut into the silicon oxide layer 16 that is under the nitride spacers 22.

After the sacrificial emitter 18 is removed, an in-situ doped emitter 26 is deposited into the emitter opening 24, and is partially etch to remove a portion of the in-situ doped emitter 26, so that the in-situ doped emitter 26 is below the nitride spacers 22. As similarly shown in FIG. 4, an optional silicide layer 28 is formed and deposited over the recessed in-situ doped emitter 26. An oxide layer (shown as oxide layer 30) is deposited using, for example CVD or plasma-enhanced CVD, and is planarized using a chemical mechanical polishing (CMP) process.

The emitter trench 32 is etched into oxide layer 30, over the recessed in-situ doped emitter 26 (and silicide layer 28). An optional barrier nitride layer may also be present, although not shown in the figures. A tungsten (W) wiring is deposited into the emitter trench 32. As with the embodiment shown in FIGS. 1-8, the self-aligned sacrificial emitter (SASE) process improves the current carrying capability of the tungsten (W) wiring of the emitter and base of this bipolar transistor. The self-aligned sacrificial emitter is narrower, which allows for a lower emitter resistance, and a faster overall device.

It is understood that additional processing steps for bipolar junction transistor, as known in the art, are needed to integrate bipolar junction transistor with a CMOS device.

Figure 12:
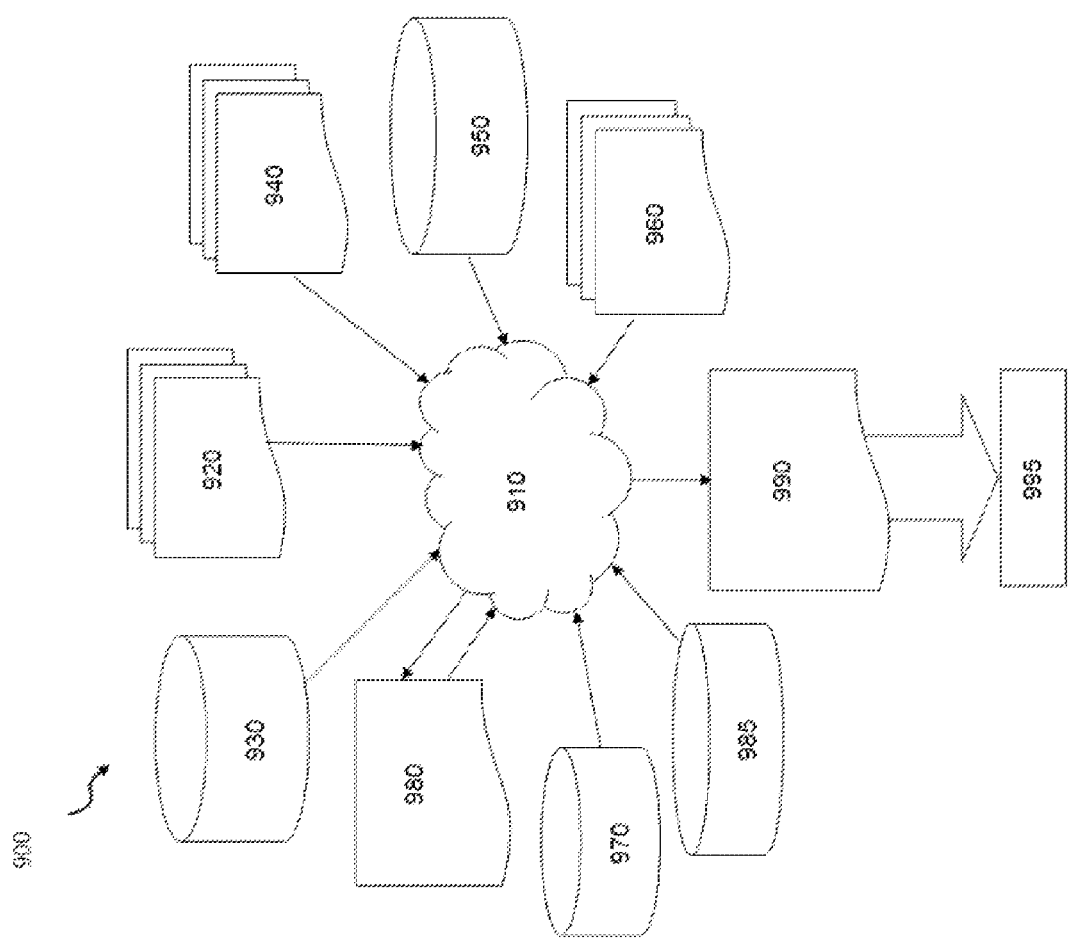
FIG. 12 is a flow diagram of a design process used in semiconductor design, manufacture, and/or test according to embodiments of the invention.

FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming local wiring for a bipolar transistor with a self-aligned sacrificial emitter, comprising:
   performing an etch to remove the sacrificial emitter to form an emitter opening between nitride spacers;
   depositing an in-situ doped emitter into the emitter opening;
   performing a recess etch to partially remove a portion of the in-situ doped emitter;
   depositing a silicon dioxide layer over the recessed in-situ doped emitter;
   planarizing the silicon dioxide layer via chemical mechanical polishing;
   etching an emitter trench over the recessed in-situ doped emitter; and
   depositing tungsten and forming a tungsten wiring within the emitter trench via chemical mechanical polishing.

2. The method of claim 1, further comprising etching at least one base trench in base regions of the bipolar junction transistor.

3. The method of claim 2, further comprising depositing tungsten and forming wiring in the at least one base trench via chemical mechanical polishing.

4. The method of claim 1, further comprising, prior to performing the etch to remove the sacrificial emitter, performing a silicon dioxide etch to form base trenches in base regions of the bipolar transistor.

5. The method of claim 4, further comprising, after performing the silicon dioxide etch to form the base trenches, depositing tungsten and forming wiring into the base trenches via chemical mechanical polishing.

6. The method of claim 5, further comprising, after depositing the tungsten wiring into the base trenches, depositing a silicon dioxide layer to bury the tungsten wiring in the base trenches.

7. The method of claim 1, further comprising, prior to depositing the in-situ doped emitter, removing a base oxide below the sacrificial emitter.

8. The method of claim 1, wherein performing the etch to remove the sacrificial emitter includes:
a first etch to remove a cap layer over the sacrificial emitter and partially remove a silicon dioxide layer surrounding the sacrificial emitter; and
a second etch to remove the sacrificial emitter.

9. The method of claim 1, further comprising forming a silicide layer on the recessed in-situ doped emitter.

10. A method of forming local wiring for a bipolar transistor with a self-aligned sacrificial emitter, comprising:
performing an etch to remove the sacrificial emitter to form an emitter opening between nitride spacers;
depositing an in-situ doped emitter into the emitter opening;
performing a recess etch to partially remove a portion of the in-situ doped emitter;
depositing a silicon dioxide layer over the recessed in-situ doped emitter;
planarizing silicon dioxide layer via chemical mechanical polishing;
etching an emitter trench over the recessed in-situ doped emitter and base trenches in base regions of the bipolar transistor; and
depositing a tungsten forming a tungsten wiring within the emitter trench and the base trenches via chemical mechanical polishing.

11. The method of claim 10, further comprising, prior to depositing the in-situ doped emitter, removing a base oxide below the sacrificial emitter.

12. The method of claim 10, wherein performing the etch to remove the sacrificial emitter includes:
a first etch to remove a cap layer over the sacrificial emitter and partially remove a silicon dioxide layer surrounding the sacrificial emitter; and
a second etch to remove the sacrificial emitter.

13. The method of claim 10, further comprising forming a silicide layer on the recessed in-situ doped emitter.

14. A method of forming local wiring for a bipolar transistor with a self-aligned sacrificial emitter, comprising:
performing a silicon dioxide etch to form base trenches in base regions of the bipolar transistor;
depositing tungsten and forming a tungsten wiring within the base trenches via chemical mechanical polishing;
depositing a silicon dioxide layer to bury the tungsten wiring in the base trenches;
performing an etch to remove the sacrificial emitter to form an emitter opening between two nitride spacers;
depositing an in-situ doped emitter into the emitter opening;
performing a recess etch to partially remove a portion of the in-situ doped emitter;
depositing an silicon dioxide layer over the recessed in-situ doped emitter;
planarizing silicon dioxide layer via chemical mechanical polishing;
etching an emitter trench over the recessed in-situ doped emitter and base trenches in base regions of the bipolar transistor; and
depositing tungsten and forming a tungsten wiring within the emitter trench via chemical mechanical polishing.

15. The method of claim 14, further comprising, prior to depositing the in-situ doped emitter, removing a base oxide below the sacrificial emitter.

16. The method of claim 14, wherein performing the etch to remove the sacrificial emitter includes:
a first etch to remove a cap layer over the sacrificial emitter and partially remove an silicon dioxide layer surrounding the sacrificial emitter; and
a second etch to remove the sacrificial emitter.

17. The method of claim 14, further comprising forming a silicide layer on the recessed in-situ doped emitter.

18. A device structure for a bipolar junction transistor with a self-aligned sacrificial emitter, the device structure comprising:
a recessed in-situ doped emitter over a base layer;
a silicon dioxide layer over the recessed in-situ doped emitter;
an emitter trench within the silicon dioxide layer and over the recessed in-situ doped emitter, the emitter trench including a tungsten wiring; and
base trenches in the silicon dioxide layer over base regions, the base trenches including the tungsten wiring.

19. The device structure of claim 18, further comprising an additional silicon dioxide layer over the emitter and base trenches, such that the base trenches are buried within the silicon dioxide layer.

20. The device structure of claim 18, further comprising a silicide layer over the base layer in the base regions and over the doped emitter, wherein the silicide layer is directly under the tungsten wiring in the base regions, and the silicide layer is directly under the tungsten wiring in the emitter.

* * * * *